United States Patent
Murray et al.

[11] Patent Number: 6,011,345
[45] Date of Patent: Jan. 4, 2000

[54] DEVICE AND METHOD FOR CONTROLLING TRANSDUCTIVE SYSTEMS

[75] Inventors: John Murray, Centereach, N.Y.; Gareth J. Knowles; Bruce L. Bower, both of Williamsport, Pa.

[73] Assignee: EMF Industries, Inc., South Williamsport, Pa.

[21] Appl. No.: 08/796,950

[22] Filed: Feb. 7, 1997

Related U.S. Application Data

[60] Provisional application No. 60/011,326, Feb. 8, 1996.

[51] Int. Cl.[7] .................................................. H01L 41/08
[52] U.S. Cl. .......................... 310/321; 310/326; 310/328; 310/316.01
[58] Field of Search .................... 310/316, 317, 310/319, 321, 326, 327, 330–332, 328; 318/116

[56] References Cited

U.S. PATENT DOCUMENTS

| | | |
|---|---|---|
| 4,158,787 | 6/1979 | Forward ................................ 310/321 X |
| 4,565,940 | 1/1986 | Hubbard, Jr. ............................ 310/326 |
| 4,849,668 | 7/1989 | Crawley et al. ...................... 310/326 X |
| 4,868,447 | 9/1989 | Lee et al. ................................. 310/328 |
| 5,032,753 | 7/1991 | Yamaguchi et al. ................. 310/321 X |
| 5,130,948 | 7/1992 | Laukien .............................. 310/328 X |
| 5,270,607 | 12/1993 | Terajima .............................. 310/321 X |
| 5,424,596 | 6/1995 | Mendenhall et al. .................... 310/328 |
| 5,525,853 | 6/1996 | Nye et al. ............................ 310/328 X |
| 5,558,477 | 9/1996 | Browning et al. ................... 310/326 X |
| 5,838,092 | 11/1998 | Wang et al. ............................ 310/326 |

*Primary Examiner*—Mark O. Budd
*Attorney, Agent, or Firm*—Cahn & Samuels, LLP

[57] ABSTRACT

The present invention provides methods and systems for controlling transductive structures to achieve a desired performance objective. According to one aspect, the present invention provides a controller which simulates a synthetic admittance or impedance when coupled to a bicoupled device and effectively cancels the reactance of the bicoupled device. Cancelling the reactance of the bicoupled device allows energy to be reflected back into an energy storage portion of the circuit resulting in an energy efficient damping and/or control system.

16 Claims, 5 Drawing Sheets

ESE–Energy Storage Element
CWH–Comparator with Hysteresis
VCR–Voltage Converter & Regulator

DEVICE AND METHOD FOR CONTROLLING TRANSDUCTIVE SYSTEMS

This application claims the benefit of U.S. Provisional Application No. 60/011326, filed on Feb. 8, 1996.

TECHNICAL FIELD

The present invention relates to the synthesis of generalized admittance circuitry and its coupling to transductive structures. The generalized admittance circuitry can be combined with certain types of actuation mechanisms or devices to form a regenerative admittance control system for electromechanical or electromagnetomechanical coupled structures or systems. More particularly, the present invention relates to lossless embodiments of this generalized admittance circuitry and its coupling to certain types of active devices or mechanisms to form a lossless, quasi-active control system, which is compact, lightweight, and regenerative. A method for selecting the optimal parameters in the passive portion of the admittance controller and its embodiment in the quasi-active configuration, the modification of the lossless implementation to form an internally active—externally passive damping mechanism, and the amalgam of active and passive modes of operation of the new admittance controller method to form a new vibratory damping apparatus, i.e., a vibrostatic system, are also provided.

BACKGROUND OF THE INVENTION

Systems that rely upon the converse effect, i.e., the conversion of electrical energy to mechanical work, to affect the behavior of the systems may be identified as transductive systems. Bicoupled transductive systems are systems whose actuation mechanisms display both direct, i.e., mechanical work to electrical energy conversion, and converse effects between electrical charge and mechanical work. Such systems employ electromechanical and electromagnetomechanical effects such as ferroelectric/ferroelastic piezoelectric and electrostrictors, magnetostrictors or moving magnetic induction devices such as voice coils. Typically, such devices may be divided into two categories, namely, the ferroelectric/ferroelastic piezoelectric and electrostrictors may be classified as capacitive devices, and the magnetostrictors or magnetic induction devices may be classified as inductive devices.

A principle obstacle to the utilization of converse effect capacitive or inductive devices for transductive systems is the extreme inefficiency and heat dissipation requirements of the electronics to drive these reactive mechanisms. Purely resistive mechanisms, however, can be defined as those for which real and apparent power are substantially the same. In contrast, nearly purely reactive devices such as piezocapacitive or voice coil inductive mechanisms can evince vastly different apparent and real power characteristics. This difference leads to nearly all of the energy that is supplied to the devices being reflected. For linear or hybrid designs, the reflected energy must be damped by thermal dissipation mechanisms, which leads to very inefficient designs, heavy and bulky heat sinking requirements, and high total energy consumption requirements. Accordingly, a new method of driving these reactive mechanisms that avoids the penalties of inefficiency, heat dissipation, energy consumption, and bulk/weight is desired.

Active devices may be utilized to control transductive systems. Active devices or controllers generally comprise a distinct set of sensor circuitry, drive circuitry, and actuator circuitry. In designing an active controller utilizing well known control design methods, each of these distinct circuits is accounted for separately. As a result of treating each of these circuits separately or individually, the effect of the interaction between the electrical, mechanical, and electromechanical characteristics of each of these circuits, as well as the devices to be controlled, is neglected. In addition, well known design techniques require that the sensors and actuators be distinct devices.

Another problem with the conventional control system design approach, in addition to not taking into account the interaction between the electrical, mechanical, and electromechanical effects, is that it provides no mechanism for determining a preferred control structure, actuation authority requirements, or optimal parameter selection. Still another problem is that conventional control systems must incorporate feedback loops external to the drive circuitry and require filtering and or signal conditioning.

A further problem with conventional control systems is the requirement that a sensor measurement system distinct from the actuators be attached to the transductive system. This problem has been partially addressed with the introduction of sensoriactuation and adaptive sensoriactuation designs that utilize both the direct and converse effects. Problems with the sensoriactuation approach are numerous and begin with a circuit design which requires a comparator circuit that a priori assumes an almost exact knowledge of the reactive behavior of the actuators. However, even a simple piezoelectric device attached to a mechanical plate has an imaginary component of impedance that may change drastically from almost purely capacitive to purely inductive. Therefore, such a comparator circuit, in practice, is not useful or amenable to actual operation. In situations where it may be feasible to introduce a comparator circuit, the sensoriactuation system only provides a set of sensed measurements and allows ac commands to be sent to the actuation mechanisms. It provides no insight or method for determining what the ac commands should be. The sensoriactuation approach has no means for delivering a commanded ac voltage or current to the actuation mechanisms without a wholly separate drive amplifier stage. Therefore, there is little in practice to distinguish the ability to derive separate sensor measurements while simultaneously actuating the devices from a conventional control system that utilizes a distinct set of colocated or non-colocated sensors.

In order to solve the above-described problems, a circuit that utilizes a direct measurement of voltage and/or current levels within the drive electronics, which avoids any comparator or pseudo-comparator circuit, and which determines and delivers exactly the required ac voltage or current to a transductive system is needed. What is also required is that such a circuit architecture be readily amenable for re-calibration to effect any alternate state space controller for the system and do so in a way that lends itself to developing the optimal or near optimal selection of commanded ac voltages and/or currents. For many situations, another requirement is that this system consume little or no net energy, have a low thermal signature, and be realizable in a small footprint.

A circuit which attempts to solve these problems has been implemented in a crude fashion by shunted circuit design. However, this approach is restricted to damping vibratory motion passively. For broadband damping, a resistor is shunted across a direct effect mechanism, which is typically a piezocapacitor. For narrow band damping, both an inductor and a resistor must be shunted across the device to form a resonant LRC circuit. This circuit is usually tuned to a resonant frequency of the structure to be damped. In a resistively shunted circuit, the resistor is varied until the circuit time constant is close to the modes to be damped. In resonant shunting, both the inductor and the resistor must be tuned. The primary difficulty with resistive shunted circuits is the requirement of large resistance values to dissipate sufficient energy. However, increasing the resistance results in a decrease in the current flowing through the resistance. It is possible to optimize the resistance value, but it is typically too low to effectively dissipate energy.

More recently, there has been an interest in using RL shunted circuits. However, the large inductance required to tune the electrical resonance near a low frequency structural resonance is unreasonable for passive components. Consequently, active inductors are synthesized using op-amps and other active components such as gyrators to implement piezoelectric vibration absorbers or powered devices. This is sometimes erroneously referred to as "semi-active", although, strictly speaking, semi-active should refer to actively varying a resistance. The problem with using synthetic inductors is that the power op-amps used in synthesizing these inductors are inherently lossy. Thus, all of the aforementioned problems with respect to purely active control, namely, lack of efficiency, energy consumption, bulk/weight, and heat dissipation reappear.

There is a need in the industry for a mechanism that avoids the problem of unwanted energy absorption by capacitive (piezocapacitance) or inductive active mechanisms, and therefore improves energy flow which could be dissipated. However, it is desirable to utilize the increased energy flow more effectively, rather than simply dissipate the energy through a resistor in order to avoid the bandwidth limitations of resonant shunt design and the penalty of having lossy, bulky, and inefficient electronic components needed for synthesizing an inductor, and to improve the overall damping of a system or structure.

SUMMARY OF THE INVENTION

The present invention relates to a method of designing controllers for transductive systems, which is herein referred to as "admittance control method." This admittance control method uses direct measurement of current and voltage levels within a circuit that is coupled to inductive or capacitive devices or mechanisms and that has the ability to synthesize any desired admittance. The current and voltage measurements are used as inputs to internal feedback loops in the circuit that control the duty cycle of a discrete, analog or hybrid portion of the circuit to generate a desired admittance function as seen by the load in the generalized admittance portion of the circuit.

The present invention also relates to a wideband embodiment of the admittance controller that is lossless, compact, lightweight, and capable of driving large capacitive or inductive loads.

The present invention allows for higher efficiency, smaller size/weight, and near zero energy consumption circuit design that both integrates and replaces amplifier and control units when the synthesized generalized admittance commands coupled reactive devices or mechanisms.

The method of admittance control design replaces conventional control systems, drive amplifiers, external sensors, signal conditioning, and filtering with a system that only comprises two subcircuits. In the preferred embodiment, these two subcircuits are simultaneously integrated and executed.

A generalized admittance is a subsystem or circuit admittance that may include negative capacitance, negative inductance, and negative resistance components and a passive control subsystem or subcircuit.

By synthesizing the required generalized admittance as seen by the load, the issues of power consumption, efficiency, and heat dissipation are addressed in a way previously unaddressed by hybrid or even switching designs. Although the preferred implementation shares commonality with some switching amplifiers, an object of the present invention, unlike that of switching amplifiers, is to present a simulated generalized admittance to the load.

In accordance with the present invention, there is provided a half bridge switching mode current sourcing circuit and a full bridge voltage mode design, each incorporating four quadrant switching that uses a modified flyback topology. MOSFETS are commonly used as switches in switching power supplies and amplifiers, and they are similarly used in the present invention for the implementation of the generalized admittance synthesizing circuit. The inputs into the full bridge voltage mode design comprise a sensed reflected current from the actuation mechanism, which elicits a corresponding ac output voltage through a command block. The half bridge switching mode current sourcing design senses reflected current and voltage from the actuation mechanism, which elicits a corresponding ac output voltage through a command block. The actuation mechanisms will normally be of a reactive type exhibiting either the direct effect, the converse effect, or both, such as embodied in bi-coupled piezoelectric materials.

Bi-coupled transductive devices or actuators connected to the generalized admittance embody a new self-contained control design and implementation method defined as synthetic active. The present invention therefore comprises a set of bi-coupled actuators together with a defined generalized admittance sub circuit that corresponds to these actuators and includes both positive and negative inductance, capacitance, and a passive control subcircuit that may include resistance elements. These circuits are combined and synthesized by a four quadrant current mode or voltage mode circuit. A four quadrant circuit is a circuit which is capable of producing and controlling any combination of positive and negative voltages and currents, e.g., a positive voltage in response to a negative current, a negative current in response to a positive voltage, etc.

The required generalized admittance as seen by the load to achieve a performance objective is synthesized by multiple internal feedback loops to the command block. In one implementation of the four quadrant design, the command block consists of a pulse width modulation ("PWM") chip together with a DSP controller and/or discrete circuitry.

Figure 1:
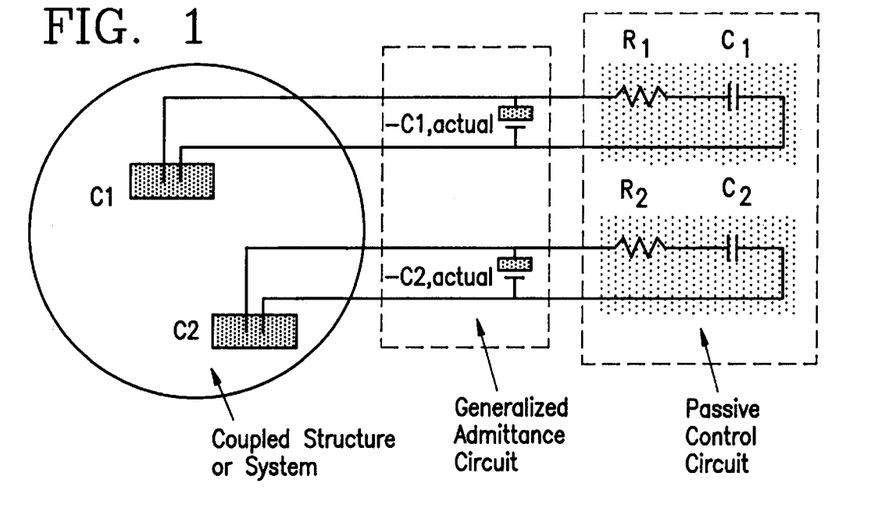
FIG. 1 is a partial block/partial circuit diagram of a mechanical structure including two actuators, two corresponding quasi-active controllers, and two passive circuits that meets a decoupling requirement.

The concatenated system of actuators and generalized admittance circuit for accepting a direct current source of energy forms a new state space active control system whose feedback/feedforward architecture is implemented directly within the generalized network portion of the circuit through feedback control of the duty cycle of the PWM controller. An example of this control system is shown in FIG. 1. The coupled system is herein referred to as synthetic active.

An advantage of this synthetic active control system is that generating the correct synthetic generalize admittance will produce a near zero energy loss, and therefore, a very low level of heat dissipation. Therefore, the illustrated control system also has a corresponding very low level of energy consumption. In addition, the circuit has the ability to recover energy through the direct effect to even further lower, net zero, or negativize the energy consumption during all or part of its operation.

In accordance with a further aspect of the present invention, a method of determining optimal control parameters for systems governed by the behavior of bi-coupled mechanisms is provided. It is an object of the invention to provide a method for parameterizing all state space controllers that do not decrease the damping for electromechanically coupled systems that use bicoupled devices for actuation. The method consists of assigning to any arbitrary state space controller for a fixed transductive system a representative that has the representation as the generalized admittance portion of the corresponding synthetic-active controller. As shown in FIG. 1 where we are required to have a decoupled control structure, this method corresponds to choosing values for R and C in each passive portion of the circuit. Therefore, the invention provides a method of selecting an optimal controller to achieve a desired performance objective for a transductive structure by optimizing this passive parameter selection.

The present invention provides the advantages of a new method for determining optimal controllers for a fixed transductive structure and a fixed desired performance metric that directly employs numerical optimization algorithms to the system, parameterizing the set of values to be optimized, and simplifying the optimization procedure. It further has the advantage of allowing tunable passive components in a universal architecture (as shown in FIG. 1 for two actuation elements) which allow for both simulated and actual comparative measurements to be made to verify the optimal controller values assigned to the passive components in this new generalized admittance design method.

It is another object of the invention to provide a modified version of the half bridge and full bridge impedance synthesizing circuits to provide a new class of passive damping circuit referred to as an internally active—externally passive circuit. The circuit is externally passive because no external power supply is used. The circuit is internally active because it includes an internal energy storage device that actively powers switching devices.

The half bridge switching mode current sourcing design senses reflected current and voltage from the actuation mechanism which elicits a corresponding output voltage through a command block. However, the modified circuit no longer has an external source of power. An internal supervisory circuit allows sufficient charge to be recovered through the direct effect to initiate the internally active switching circuit.

Prior to "turn on", while charge is building up, the circuit will function as a passive shunt, where the energy is stored rather than dissipated. After turn on, the circuit will function as a broadband damping mechanism that allows increasing energy to flow through into the charge storage mechanism and the switching subcircuit. This is accomplished by incorporating a lossless switching circuit implementation of the synthetic active method as a subcircuit of the damping circuit. The circuit will automatically shut down as vibratory motion diminishes.

An advantage of the present invention over all previous passive or semi-active shunted designs is that it solves the resistance value limitation on resistively shunted passive damping circuit designs. The present invention avoids narrow band frequency constraints on passive or semi-active resonant shunted damping designs. The present invention also avoids the inefficiency, lossiness, and bulk/weight problems of a synthetic inductor based design. The present invention achieves these and other advantages by cancelling the reactive components, e.g., blocked capacitive or free inductive components, of the impedance of bicoupled actuation mechanisms. These reactive components are what prevent efficient mechanical energy recovery in conventional resistive or resonant passive or semi-active circuit designs.

In addition to allowing energy recovery, a further advantage of the present invention is that it matches the damping performance of conventional passive and semi-active resonant frequency shunt design at any finite number of resonant modes. To illustrate why this is so, observe that at a fixed frequency $\omega_0$ the transfer function of an inductor, real or synthetic is $j\omega_0 L$. Multiplying numerator and denominator by j and using the fact that $j^2=-1$, the transfer function of an inductance at fixed frequency $\omega_0$ is $Z_L=j\omega L=1/j\omega_0(-C)=(-1)/j\omega_0 C=Z_{-C}$, which is the transfer function of a negative capacitance, $-C$. Thus, at a set of fixed frequencies, the present invention can be made to act exactly as resonant shunt designs, by choosing $C=1/L$ for a single mode or frequency in the above example. However, unlike a resonant shunt, the present invention achieves damping over a wide range of frequencies, e.g., by canceling the impedance $Z_C$ of the piezocapacitor of the above example.

A further object of the present invention is to provide a vibrostatic method and system for damping transductive systems. In accordance with this aspect, an amalgam of the synthetic active design in both its active and passive modes of operation is provided.

The vibrostatic system is analogous to a thermostatic system. For example, like a thermostat, a performance metric is set. With a thermostat, the performance metric would be maintaining a desired temperature. With the vibrostatic system, the performance metric may be maintaining a desired level of vibration amplitude or strain energy. When the metric is exceeded, the vibrostatic system, like a thermostat, will "kick in" into its synthetic active lossless mode. When the metric is met, for example, when disturbance amplitude is within a predetermined tolerance level, the vibrostatic system becomes idle, just as a thermostat turns a heating or cooling system off when a desired temperature tolerance is achieved. However, unlike a thermostat, idle may or may not mean that the vibrostatic system is inactive, even when the system is without external power. For example, the vibrostatic system may idle by operating in the internally active—externally passive mode of operation.

One advantage of the internally active—externally passive mode of operation, is that in one implementation, the circuit may consist of control circuitry which requires less energy to turn on than the digital control circuitry of the synthetic admittance circuit. However, an advantage of its incorporation in a vibrostatic design is that the storage capacitors used in the vibrostatic system may have an initial charge level when the active mode desists. This implies a shorter or possibly zero time constant before the internally active mode is activated without external power, except that provided by mechanical energy recovery.

A further advantage of the vibrostatic design is that no power is drawn and no external energy burden is placed on the system when the vibratory levels are within a predetermined tolerance. A further advantage of this design is that even during the "no power" mode, the circuit is acting as a damping circuit that meets or exceeds the damping performance of a resonant or resistive shunt. A still further advantage of the vibrostatic system is that when vibratory levels exceed a predetermined tolerance, the system switches to the active mode, where it functions as a quasi-active controller, operating at a high voltage, but with near zero energy consumption during each cycle. A still further advantage of the vibrostatic system is that it provides some level of damping even if external power is accidentally or erroneously shut off.

An embodiment of the present invention provides a method for synthesizing a generalized admittance comprising: sensing a current flowing through a load; calculating a voltage value corresponding to the sensed current to simulate a negative reactance when measured from the load; and controlling a switching circuit to produce an average voltage over a switching cycle across the load, the average voltage value being equal to the calculated voltage value.

Another embodiment of the present invention provides a quasi active controller comprising: a bicoupled device having a predetermined reactance; a first current sensor coupled to the bicoupled device, the current sensor sensing a current flowing through the bicoupled device; a first signal processing device coupled to the current sensor, the signal processing device calculating a voltage value using a first predetermined transfer function; a control circuit coupled to the first signal processing device, the control circuit producing a control signal in response to the voltage value; and a switching circuit coupled to the control circuit and to the bicoupled device, the switching circuit receiving the control signal and producing a voltage responsive to the control signal to simulate a generalized admittance to the bicoupled device.

A further embodiment of the present invention provides a quasi active controller comprising: a bicoupled device having a predetermined reactance; a voltage sensor coupled to the bicoupled device, the voltage sensor sensing a voltage across the bicoupled device; a first signal processing device coupled to the voltage sensor, the first signal processing device computing a current value using a predetermined transfer function; a control circuit coupled to the signal processing device, the control circuit producing a control signal in response to the current value; and a switching circuit coupled to the control circuit and to the bicoupled device, the switching circuit receiving the control signal and producing a voltage responsive to the control signal to simulate a generalized admittance to the device.

A further embodiment of the present invention provides a controller for controlling a structure subject to an external load comprising: a bicoupled device coupled to the structure; and a synthetic admittance circuit coupled to the bicoupled device, the synthetic admittance circuit synthesizing a generalized admittance.

A further embodiment of the present invention provides a method for selecting optimal parameters for a synthetic active controller comprising: dividing a generalized admittance circuit into a first subcircuit, a second subcircuit, and a third subcircuit, the first subcircuit including a negative reactance element, the second subcircuit including a passive non-dissipative element, and the third subcircuit including a passive dissipative element; selecting a reactance value for the negative reactance element in the first subcircuit by determining and negating the reactance value for the bicoupled device; determining a range of values for the elements in the second and third subcircuits based on a predetermined performance objective; selecting an optimal value for the elements in the second and third subcircuits using conventional algorithms; and combining the optimized second and third subcircuits with the first subcircuit to form an optimal admittance controller.

A further embodiment of the present invention provides an internally active externally passive control method for controlling a structure subject to an external load comprising: absorbing energy from the structure by converting mechanical energy to electrical charge during an internally passive mode of operation; storing the electrical charge in an energy storage device; monitoring the charge level in the energy storage device; actuating a switching circuit to actively damp the structure when the charge level in the energy storage device reaches a predetermined level; and deactuating the switching circuit when the charge level falls below a second predetermined level.

A further embodiment of the present invention provides an internally active externally passive controller for controlling a structure subject to an external load: a bicoupled device coupled to the structure;a generalized admittance synthesizing circuit coupled to the bicoupled device; an energy storage element coupled to the bicoupled device; a comparator circuit coupled to the energy storage element to measure a stored energy level; and a voltage regulator circuit coupled to the comparator to produce at least one operating voltage.

A further embodiment of the present invention provides a vibrostatic control method for controlling a structure subject to a disturbance comprising: setting a tolerance level for the disturbance; actuating a switching circuit to actively damp the disturbance when disturbance exceeds the tolerance level; and deactuating the switching circuit when the disturbance is reduced below the tolerance level.

A further embodiment of the present invention provides a method for controlling vibrations in a vibrating structure comprising: coupling a bicoupled device to the vibrating structure; coupling a synthetic active circuit including a generalized admittance to the bicoupled device to cancel a reactance of the bicoupled device; and actively powering the synthetic active circuit and the bicoupled device to damp the vibrations.

DETAILED DESCRIPTION OF THE PREFERRED EMBODIMENTS

According to a first aspect, the present invention provides a method for controlling a transductive system. One example of a transductive system is a piezoelectric device coupled to a mechanical structure. A method for controlling such a transductive system involves designing a controller for the system to achieve some desired performance objective, e.g., damping or attenuating acoustic vibrations. The method is not intended to be limited to controlling piezo-coupled mechanical systems. The method is valid for controlling any bicoupled device, i.e., a device which exhibits both the direct and converse effects, coupled to a mechanical system or structure. In order to illustrate how to control a transductive system including a bicoupled device, an example is given for a piezo-coupled mechanical system.

The first step in controlling a system or structure is to develop a model. The present inventors discovered that for a piezo-coupled, single degree of freedom mechanical system, any state space control system may be modeled as a generalized admittance connected across the electrodes of the piezoelectric device. That is, for any state feedback for a single degree of freedom piezo-coupled mechanical system, e.g., a piezo-coupled mass spring damping system, $$v_p = g_1 x + g_2 x' \quad (1)$$

where $v_p$ is the voltage across the piezoelectric device, $g_1$ and $g_2$ are gain constants, and x and x' are position and velocity controlled by the piezoelectric device, the current in the s-domain is related to the voltage by the following expression:

$$I_p(s) = s\left(\frac{P_p}{(g_1 + g_2 s)} + C_p\right) V_p(s) \quad (2)$$

This is equivalent to connecting an admittance as a load across the piezoelectric device:

$$Y(s) = \frac{-I_p(s)}{V_p(s)} = \frac{-sP_p}{g_2 + g_2 s} - sC_p \quad (3)$$

The reason that the admittance is negative is that the current seen from the perspective of the piezoelectric device is the negative of the current seen from the perspective of the admittance as a load; hence, $$V_p(s) = V_L(s) \quad (4)$$

$$I_p(s) = -I_L(s)$$

$$Y(s) = \frac{I_L(s)}{V_L(s)} = \frac{-I_p(s)}{V_p(s)}$$

Figure 2:
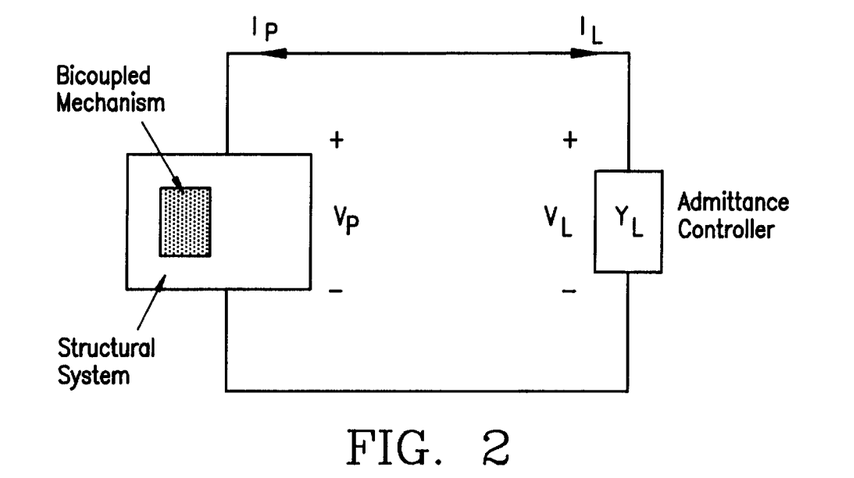
FIG. 2 is a block diagram of a structural system, bicoupled mechanism, and a synthetic admittance coupled to the bicoupled mechanism according to an embodiment of the present invention.

FIG. 2 shows the relative positions of the currents and voltages. The admittance Y(s) can be modeled as a capacitor C1 in parallel with a resistor R1 and a second capacitor C2 where, $$C_1 = -C_p \quad (5)$$

$$C_2 = \frac{-P_p}{g_1}$$

$$R_1 = \frac{-g_2}{P_p}$$

To improve damping of a piezo-coupled mechanical system, it can be shown through conventional stability analysis that the ratios, $$\frac{-P_p}{g_1}, \frac{-g_2}{P_p}$$

should be positive.

For more complex systems, especially those involving multiple transducers, the negative reactance part of the admittance is retained. However, more complex passive admittances may be required to optimize damping. Any desired admittance can, in principle, be synthesized as described below. The design of damping controllers by synthesizing such admittances is called an "admittance controller design" method.

Figure 3:
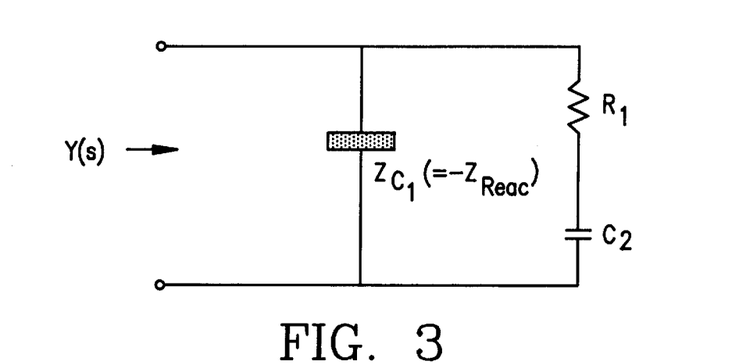
FIG. 3 is a circuit diagram of an equivalent circuit for a synthetic admittance according to an embodiment of the present invention.

FIG. 3 shows an equivalent circuit for Y(s). From equation (3) and FIG. 3, it can be seen that the admittance requires a negative capacitive element –Cp.

In a one embodiment of the present invention for a piezoelectric device, the admittance Y(s) is implemented as a transfer function H(s), where $$H(s) = Y(s) = \frac{-sP_p}{g_1 + g_2 s} - sC_p \quad (6)$$

The transfer function H(s) may be implemented by analog or digital means, for example, using a digital signal processor. In an alternative embodiment, the transfer function H(s) may be an impedance transfer function, where H(s)=Z(s)=1/Y(s).

A partial derivation of the transfer function H(s) is disclosed in U.S. Provisional Application No. 60/011326, filed on Feb. 8, 1996, the disclosure of which is incorporated by reference herein.

According to a second aspect of the present invention, a structure must be developed for the desired admittance. As shown above, to properly control an electromechanical device, the admittance is preferably a generalized admittance, i.e., it incorporates a negative capacitance or inductance. For piezoelectric materials the required control admittance incorporates negative capacitors.

According to a third aspect of the present invention, the admittance $Y_{-C}$, is non-dissipative, i.e. consume no net energy. However, unlike a normal capacitor, this device must deliver energy before receiving energy. It must therefore have an internal energy source, but consume no net energy. This phenomenon is independent of current, voltage, or poling directions on any bicoupled device or mechanism. The amplifier/controllers that are used to drive reactive (i.e. in contrast to loads that can be adequately modeled as resistive) impedance loads must include negative reactance components, which must necessarily be synthetic. By synthesizing the required admittance losslessly, mechanical energy may be recovered in an amount which exceeds the energy required to power the synthetic admittance, i.e., the power lost due to switching and core losses. When the mechanical energy recovered exceeds the losses, then the coupled amplifier driver becomes a energy source as opposed to an energy sink, enabling energy to be returned to the primary energy source—battery or capacitor.

Quasi Active Impedance/Admittance Controller Conventional attempts to synthesize a quasi-active, i.e., a loss free, synthetic admittance have been limited to synthesizing loss free resistances. An embodiment of the present invention involves synthesizing a virtually loss free synthetic admittance or impedance, including a negative capacitance or a negative inductance.

A synthetic impedance or admittance is a circuit which presents two terminals to the world, e.g., to the electrodes of a piezoelectric device and appears electrically to be an impedance or admittance to the piezoelectric device. In a preferred embodiment of the present invention for a piezoelectric device or mechanism, the two terminals of the synthetic circuit appear as a negative capacitance in parallel with a resistor and an ordinary capacitor to the device.

Figure 4:
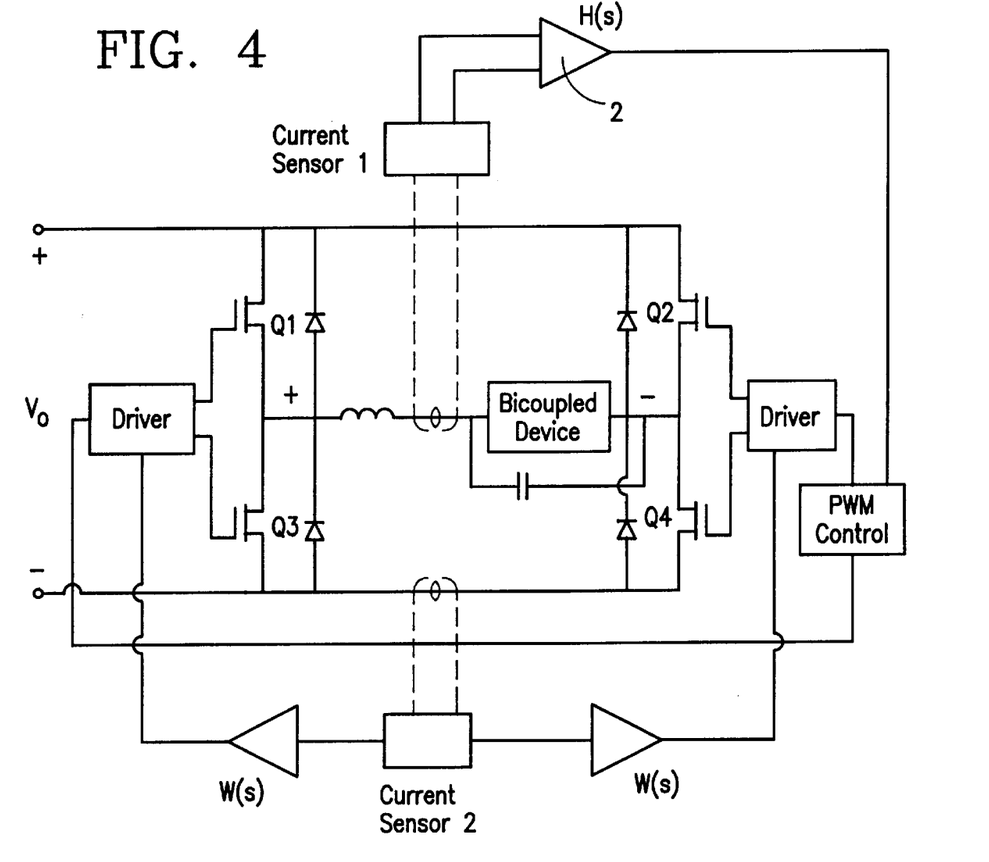
FIG. 4 is a circuit diagram of an H-bridge (bipolar power supply) implementation of a quasi-active controller according to an embodiment of the present invention.

In one embodiment, as illustrated in FIG. 4, a synthetic impedance circuit continuously senses a current flowing into its terminals, calculates what the desired voltage should be at the terminals of the bicoupled device to simulate a desired impedance and produces that voltage. The circuit calculates the desired voltage using a transfer function H(s), which in this case is the desired impedance, since the circuit senses a current and produces a voltage. The desired impedance may be calculated by analog or digital means, for example, using a DSP. For example, suppose the circuit senses a current of +2 A and the desired impedance is 2 Ohms. The circuit would then produce a voltage of +4 V. If the desired impedance is −2 Ohms, the circuit produces a voltage of −4 V for a +2 A current. By producing a voltage in response to the sensed current, the circuit is forced to appear as an impedance having the value calculated by the DSP to the external device. Dually, it is possible to sense the voltage, and generate the appropriate current.

In order for the implementation to be lossless, a switching circuit is required to control the voltage and current seen by the device. A switching circuit according to a preferred embodiment of the present invention is shown in FIG. 4. In FIG. 4 a first current sensor 1 senses the current and produces an output signal. For a piezoelectric device, a DSP 2 receives the output signal and calculates the required voltage value to produce the impedance:

$$Z(s) = \frac{1}{\frac{-sP_p}{g_1 + g_2 s} - sC_p} \quad (7)$$

The voltage value is input into a pulse width modulator to control a plurality of switches, preferably four switches, to produce the voltage at the terminals of the synthesizing circuit. The required voltage is the average voltage seen by the bicoupled device over a period T.

Figure 5:
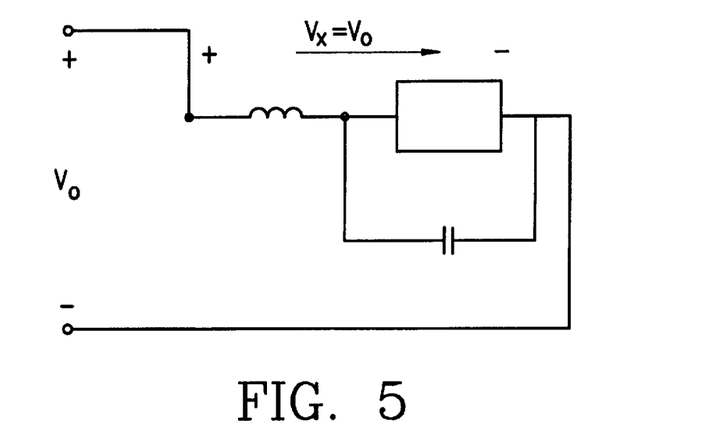
FIG. 5 is a partial block/partial circuit diagram of a bicoupled device, a capacitor, and an inductor during a first phase of a cycle of the circuit of FIG. 4.
Figure 6:
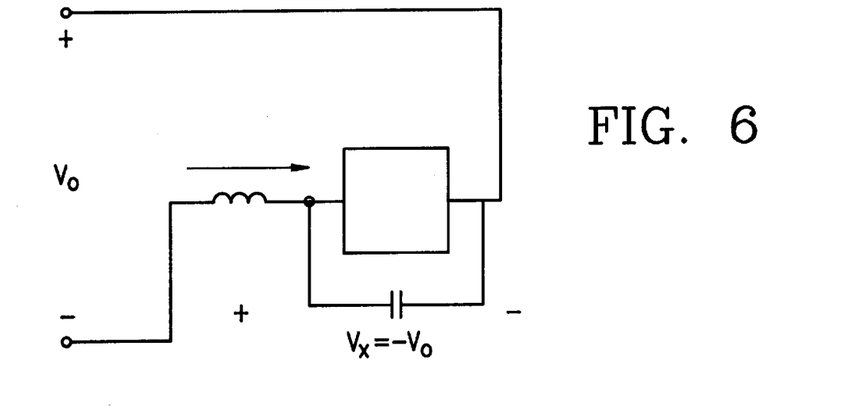
FIG. 6 is a partial block/partial circuit diagram of a bicoupled device, a capacitor, and an inductor during a second phase of a cycle of the circuit of FIG. 4.
Figure 7:
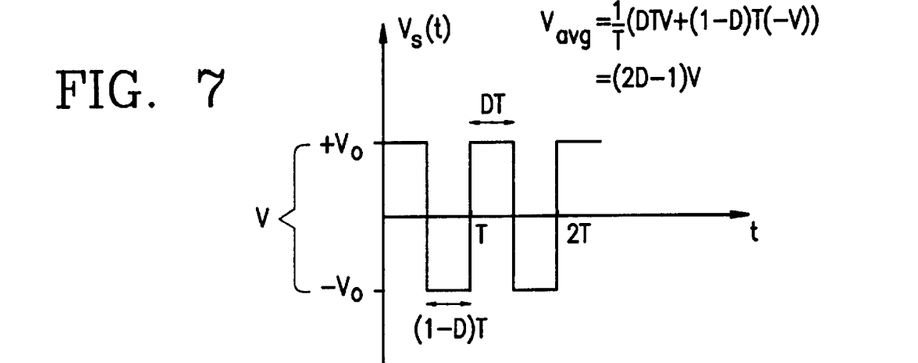
FIG. 7 is a graphical representation of a voltage produced by the circuit of FIG. 4.

FIG. 7 illustrates how this voltage is produced. Assume the period T is divided into two phases of duration DT and (1−D)T, respectively. During the first phase, switches 1 and 4 are conducting, and switches 2 and 3 are nonconducting, and so a voltage $V_x = V_o$ appears from the + to the − terminal of the series combination of inductor and capacitor, as shown in FIG. 5. During the second phase, switches 2 and 3 are conducting, and switches 1 and 4 are nonconducting, and so a voltage Vo appears from the − to the + terminal of the series combination of the inductor and the capacitor, or equivalently, $V_x = -V_o$ appears from the + to the − terminal, as shown in FIG. 6. Over the entire cycle; therefore, the average voltage across the series combination is $(2D-1)V_o$.

Since the low pass filter functions as an averaging circuit, the actual voltage seen by the bicoupled device is the average voltage over each cycle.

Thus, if D is greater than 0.5, the voltage as seen by the bicoupled device will be positive. If D is less than 0.5, the voltage seen by the piezo is negative. Thus, by varying D, the voltage seen by the bicoupled device can be controlled to produce the desired value. The switching occurs sufficiently fast such that the low pass filter outputs the average voltage to the bicoupled device over each cycle. In a preferred embodiment, the switching frequency is preferably in a range of from about 20 kHz to no more than about 200 kHz.

Figure 8:
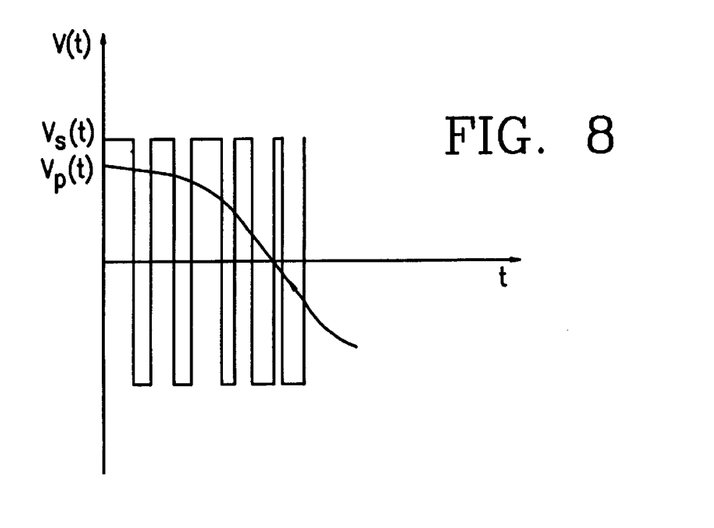
FIG. 8 is a graphical representation of an average voltage produced by the circuit of FIG. 4.

The bicoupled device sees a series of average voltages, which when added together over time appear as a continuous waveform $v_p(t)$, which, given the sensed current, appears as the required admittance to the piezoelectric device. FIG. 8 illustrates an exemplary voltage waveform $v_p(t)$. FIG. 8 also illustrates $V_s(t)$, which when averaged by the low pass filter, forms the waveform $v_p(t)$.

To illustrate how a desired voltage which produces a desired impedance or admittance is calculated for a piezoelectric device, suppose a piezo-coupled mechanical structure is mechanically excited, and the resulting current flowing into the piezoelectric device is a given by 0.1 cos 200t A.

For illustrative purposes, suppose $g_1$ and $g_2$, the gain constants are both equal to −1, $P_p$ is equal to 0.001, and $C_p$ is equal to 1 $\mu$F. Substituting these values into equation 7, and s=jω, where ω=200, $$Z(j200) = \frac{1}{\frac{-j(200)(.001)}{-1 + j(-1)(200)} - j(200)(.000001)}$$

$$= 963.39 + j(187.88)$$

Since $Z(j\omega) = V(j\omega) / I(j\omega)$, $$V(j\omega) = I(j\omega) * Z(j\omega)$$
$$= .1 + j(0) * 963.39 + j(187.88)$$
$$= 96.34 + j(18.78)$$

In polar coordinates,
=98∠11°.

Finally, in the time domain, v(t)=98 cos (200t+11°) V to produce the required impedance.

To implement the voltage v(t), a switching circuit produces the waveform v(t) using pulses, each having an average voltage $(2D-1)V_o$. The piezoelectric device sees only the average voltage produced during each cycle summed to form the continuous waveform v(t).

Because the voltage is produced by high speed switching, a low-pass filter consisting of the inductor series with the capacitor (see FIG. 4) is preferred to attenuate high-frequency components. This LC filter, which in a preferred embodiment comprises an inductor in series and a capacitor in parallel with the bicoupled device, raises two problems: first, if at the end of the first phase of a cycle, current is flowing in the direction of the arrow in FIG. 5, then it must continue to do so at the beginning of the second phase, as shown by the arrow in FIG. 6, since inductor current cannot change instantaneously. The diodes in antiparallel with switches 2 and 3 provide a path for this current, while maintaining the required voltage. The diodes in antiparallel with switches 1 and 4 provide a similar path during the first phase. In this manner energy is recovered from the system.

The second problem arising from the LC filter does not occur with an ordinary resistive load. It does arise, however, if the load is removed, or if the load is reactive, as will normally be the case in the present embodiment. In either of these cases, the L-C filter will give an undamped resonance which will make a flat frequency response impossible, and may allow the output voltage to rise to dangerous levels. Since the purpose of the switching amplifier is to avoid excessive power dissipation, using a resistive load to damp the resonance is undesirable, since the energy is dissipated and lost as heat. A preferred method to damp the resonance is to use feedback. Although various feedback configurations are possible to achieve this damping, a preferred method is to feed back a signal proportional to the capacitor current in the L-C filter. This feedback is shown by the second current sensor 2 and the signal processing blocks W(s) in FIG. 4.

A method for designing a control system according to an embodiment of the present invention includes determining the parameters in the transfer function H(s), whether H(s) is an impedance or an admittance, and implementing the transfer function using a lossless design. In the present preferred embodiment, a switching circuit is used because switching allows energy to returned to the source during each switching cycle rather than being wasted, e.g., dumped in a resistor.

Some of the parameters in H(s) can be measured. Others depend on damping. For example, for a piezoelectric device, $P_p$ and $C_p$ are parameters related to the piezoelectric element that can be measured. Gain constants $g_1$ and $g_2$ are gain constants that must be chosen a desired level of damping and stability. Once the parameters for H(s) are chosen, a circuit, preferably a switching circuit can be connected across the terminals of the bicoupled device to produce the required damping. As discussed above, the preferred electrical implementation of the synthetic admittance or impedance is energy efficient. Accordingly, power switching circuits, rather than linear circuits, are used to implement the preferred embodiment. However, although the present preferred embodiment utilizes power switching circuits, there are several alternative switching strategies, each of which depend on the relative durations of "ON" and "OFF" periods of electronic switches. Some alternative switching strategies that are within the scope of the present invention are the classical buck and flyback circuits, and their transformer-based derivatives; the Cuk converter, and voltage-fed and current-fed single-ended, double-ended, and H bridge circuits.

Within each circuit, there is a choice of power switching devices: one can use Bipolar transistors, MOSFETS, or IGBTS; with higher power levels, and less stringent bandwidth requirements, one could use GTO thyristors or MCT devices.

Finally, although the preferred control method for the power switching circuit is pulse width modulation, which switches with a constant period and a variable duty cycle, various control strategies are possible. Some examples of alternative control strategies which may be used are: constant "ON" period, variable frequency switching; and constant "OFF" period, variable frequency switching.

In addition to the above mentioned H-bridge circuit, alternative circuits can be used to generate the appropriate voltage or current response. For example, a variable turns ratio transformer may be used to produce the required voltage or current. A flyback-based implementation of a variable turns-ratio transformer may be used. However, this design is difficult to extend to four-quadrant operation.

Figure 9:
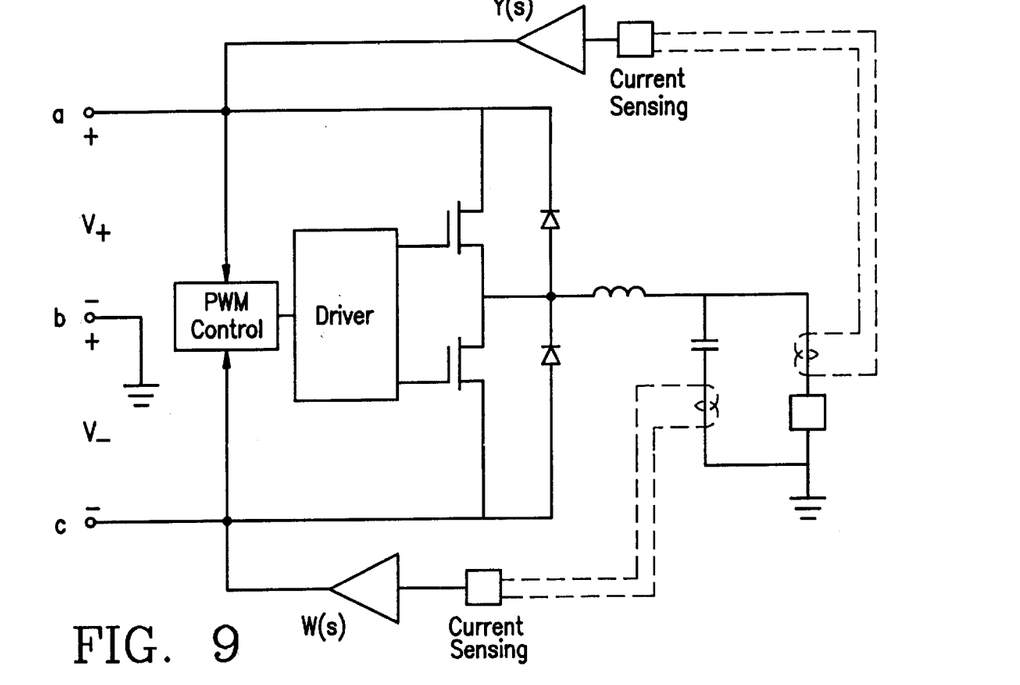
FIG. 9 is a partial block/partial circuit diagram of a bipolar implementation of an admittance controller according to an embodiment of the present invention.

Accordingly, the preferred embodiment of the present invention is a controlled voltage source, using power MOSFETS as switches, with pulse-width modulation (PWM) control as described above. The preferred configuration is an H-bridge when grounding of the load is not a requirement, or a double-ended (bipolar power supply) when one side of the load is required to be grounded. FIG. 9 shows an example of a bipolar half bridge implementation of the admittance control circuit.

As illustrated, the full bridge circuit (FIG. 4) and the half bridge circuit (FIG. 9) circuit each function as a controlled voltage source in the normal situation when the power supply is a constant-voltage source. However, either circuit could function as a controlled current source in the less common situation where the power supply is a current source.

The present invention provides wide bandwidth and four-quadrant operation; the latter means that the circuit must maintain control with current and voltage in either direction, independently of each other. This contrasts with switching power supplies, in which bandwidth is low, and voltage and current unidirectional, or a synthetic resistance, in which current and voltage must be in the same direction, since the admittance is resistive.

Figure 12:
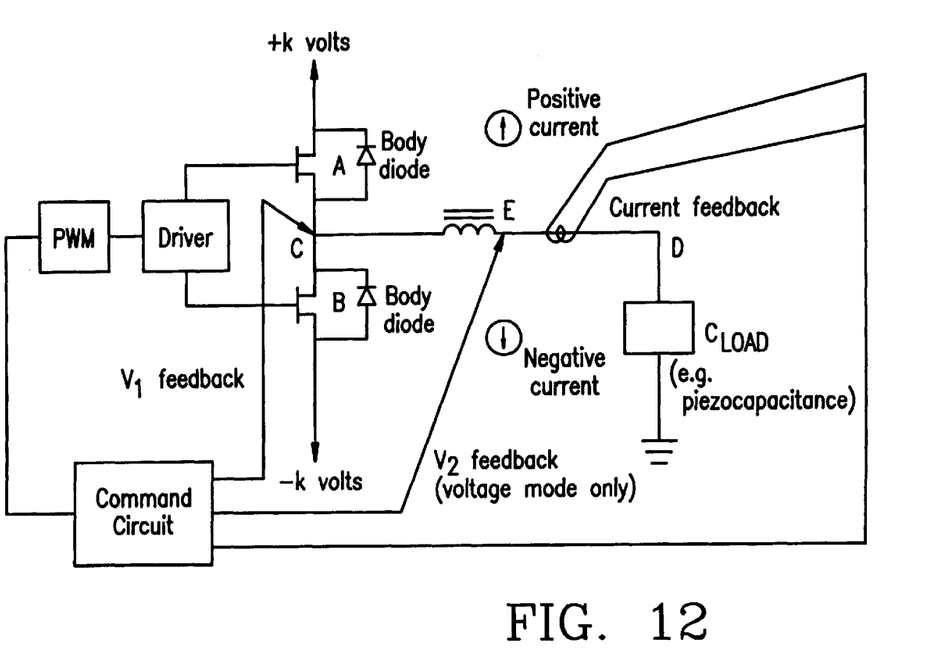
FIG. 12 is a partial block/partial circuit diagram of a half bridge bipolar generalized admittance synthesizing circuit.

A preferred embodiment of a half bridge synthetic switching circuit is illustrated in FIG. 12. The switch A and the switch B are MOSFET power transistors in the preferred embodiment; however, this does not exclude IGBT or other implementations. The switches have a 50% duty cycle with either A ON and B OFF or B ON and A OFF. In operation, when switch A is ON, switch B is OFF, and L1 is charging with increasing current flow. The cycle of conditions continues at a high frequency rate. The operation at a continuous duty cycle of 50% results in a net average at $C_{LOAD}$ being zero. Consequently, only the duty cycle rate need be varied to achieve the desired signal via a PWM chip (not shown). Therefore, the sequence continues as follows: switch A is OFF, and switch B is OFF. However, the positive current induced in L1 when switch A was ON and switch B was OFF continues to flow in the same direction in a decreasing manner. The only path available for this current during the brief "dead time" period is through the incorporated antiparallel body diode of switch B. The rate of charging of $C_{load}$ decreases. Next, switch A is OFF and switch B is ON. L1 is charging with increasing reverse current flow. Next, switch A is OFF and switch B is OFF. The negative current induced in L1 continues to flow in the same direction in a decreasing manner. The only path available for this current during the brief dead time is through the incorporated antiparallel body diode of switch A. The rate of charge of $C_{load}$ decreases.

The functionality of the new method of admittance control is described in terms of the half-bridge bipolar generalized impedance circuit shown in FIG. 12. Without loss of generality the circuit is coupled to a single piezoelectric device. An exactly similar description will implement the design for multiple piezoelectric devices or, more generally, multiple bicoupled capacitive or inductive mechanisms through simply adding additional negative admittance subcircuits, one such subcircuit for each active mechanism and a multiple input multiple output (MIMO) passive control subcircuit. We will take as given a particular choice in control strategy such as state space control and a particular choice in control structure such as totally decoupled design to be a priori chosen and will proceed to functionally describe the operation of the admittance control method for a fixed such selection in the following steps:

Step 1: The structural load is being excited in some fashion that we would like to diminish by applying a coupled feedback design and mechanisms for implementation by applying a commanded voltage $V_{command}$ to the piezoelectric device.

Step 2: The structural load causes an initial strain in the piezoelectric device that in turn causes a surface charge in the poling direction and a voltage drop across the device.

Step 3: The current is initially fed back to a command circuit which tabulates the piezocapacitance values derived from material values, structural modeling and possibly disturbance modeling. In practice, the embodiment uses the blocked capacitance that is normally vendor supplied. The values are now used compute an estimated initial voltage drop across the coupled device, through use of the well known relation Q=Cv, where Q is the charge, v is the voltage, and C is the capacitance of the device.

Step 4: The admittance control method now stipulates that the desired generalized admittance consists of two subcircuits. The first subcircuit has an impedance $-Z_C$, the second subcircuit has an impedance corresponding to the passive control portion that is determined by the performance requirement, control design method, i.e., whether we choose H-infinity, LOG-LTR, or any other state space approach to define the desired feedback gains.

Step 5: The passive circuit is placed in parallel with the first circuit and the total admittance $Z_{des}$ is computed. It is important to note that the multi-port modeling approach used to analyze the desired total admittance allows us to permanently fix the value of $-Z_C$ as the design takes into account any apparent changes in reactance value as a function of variable loading, mechanical or applied voltage conditions. We typically therefore choose $-Z_C$ as minus the blocked piezocapacitance.

Step 6: To now operate as a current mode control device we measure the voltage drop $V_{command}$ across the leads of the active coupled device. A four quadrant current mode system shown in FIG. 12 now can be utilized as described to synthesize the desired concatenated synthetic active circuit. To obtain the desired voltage level in this embodiment we use the fact that $i_{des}=v_{des}/Z_{des}$, where $i_{des}$ is the desired current, $v_{des}$ is the measured voltage, and $Z_{des}$ is the desired impedance to produce the desired current. The measured voltage therefore defines the required current. To implement this design using a PWM approach now use the relationship $D=f(V_{command}, i_{load}, V_1, V_0)$, where D is the duty cycle, $V_0=k$ is the input dc voltage level into the four quadrant switching portion of the circuit, $V_1$ is the inner loop feedback from the half bridge tank circuit, $i_{load}$ is the current measured going into the active coupled device (which by Kirchoff's Law is equal to the current through the capacitor) and $v_{command}$ is the voltage drop measured across the active coupled device terminals. This provides an exact prescription for the desired duty cycle at time $t_1$.

Step 7: For time $t_1 > t_0$, voltage $V_{command}$ has been applied to the actuation mechanism over the interval $(t_0, t_1)$. If the system performance meets the required level as measured by current feedback as a measure of the strain as seen on the piezo device then the commanded voltage is set to zero. Otherwise the system continues as described in step 5.

Internally Active—Externally Passive Control

Figure 10:
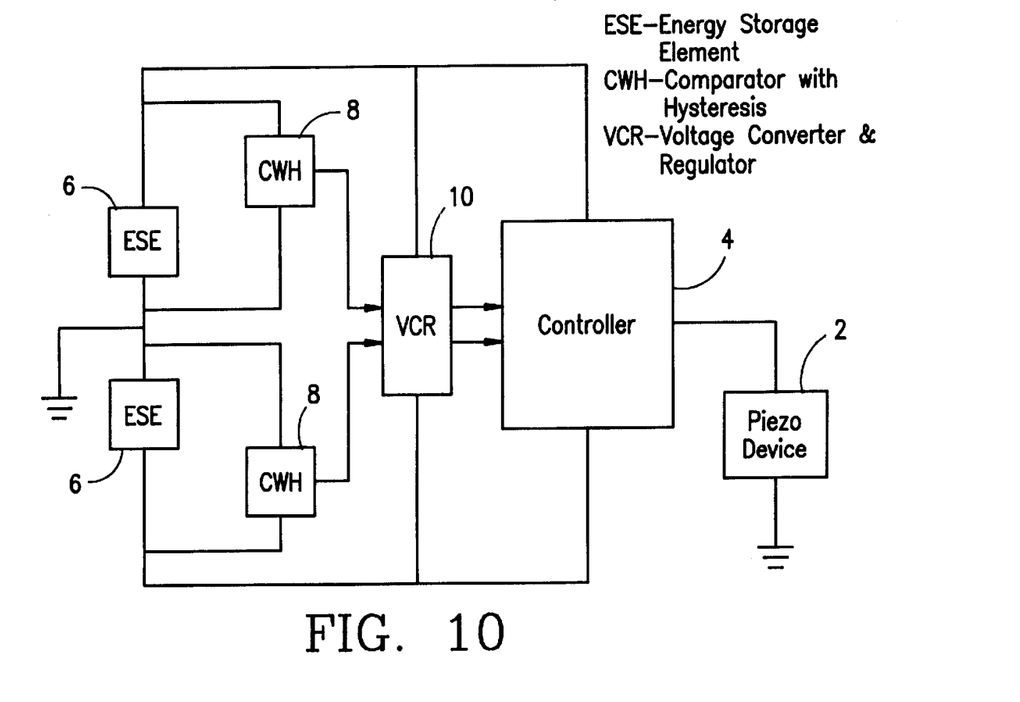
FIG. 10 is a partial block/partial circuit diagram of an internally active-externally passive circuit according to an embodiment of the present invention.

According to a further aspect, the present invention provides a method and system of internally active—externally passive control. One example of a circuit used to implement the internally active—externally passive control method is shown in FIG. 10. The circuit operates externally passively because there is no external energy source, except for mechanical energy converted to electrical energy through the bicoupled device 2. The circuit is internally active because it uses a switching admittance controller 4 to actively synthesize the desired impedance as seen by the bicoupled device 2.

The internally active—externally passive circuit includes energy storage elements 6, such as capacitors or batteries, which may be initially uncharged. When the mechanical system begins to vibrate, diodes (shown in FIG. 9) in the controller 4 form a rectifier circuit to charge the energy storage element 6. While the energy storage elements are charging, the controller 4 is off. Even though the controller is off, because energy is being absorbed from the mechanical system, some damping is achieved.

When sufficient energy is stored in the energy storage elements 6, as sensed comparator circuits 8, a voltage regulator 10, supplies operational power to the controller 4. The controller 4 switches on the control and driver circuitry to synthesize the desired admittance as described above. When the controller is ON, the circuit operates in the internally active—externally passive mode of operation.

If the energy stored in energy stored elements 6, as sensed by the comparator circuits 8 falls below a preset value, the controller turns OFF and the circuit switches back to an internally passive mode of operation to recharge the energy storage elements 6. Hysteresis is preferably incorporated in the comparators 6 to prevent excessive switching between internally active and internally passive modes of operations.

Vibrostatic Control Method and System

According to a further aspect of the present invention, active and internally active-externally passive control methods and circuitry implementation, that use the concept of synthetic active external or internal impedance are combined. The resulting combination is the vibrostatic control method and system. The vibrostatic system operates like a thermostat. For example, like a thermostat, a performance metric is set. With a thermostat, the performance metric would be maintaining a desired temperature. With the vibrostatic system, the performance metric may be maintaining a desired level of vibration amplitude or strain energy. When the metric is exceeded, the vibrostatic system, like a thermostat, will "kick in" into its active synthetic lossless mode. When the metric is met, for example, when disturbance amplitude is within a predetermined tolerance level, the vibrostatic system becomes idle, just as a thermostat turns a heating or cooling system off when a desired temperature tolerance is achieved. However, unlike a thermostat, idle may or may not mean that the vibrostatic system is inactive, even when the system is without external power. For example, the vibrostatic system may idle by operating in the internally active—externally passive mode of operation.

Unlike the internally active—externally passive mode of operation, the supervisory control circuitry for the vibrostatic system is now implemented digitally, as discussed above with respect to the active synthetic generalized impedance switching architecture.

Figure 11:
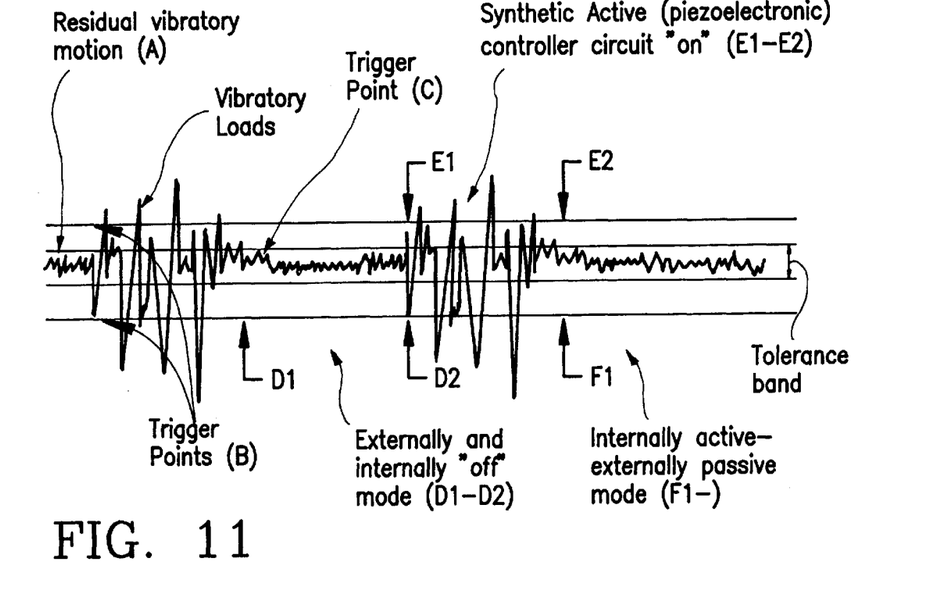
FIG. 11 is a graphical representation of the operation of a vibrostatic control system according to an embodiment of the present invention.

As shown in FIG. 11, the structure is subject to low-level ambient vibratory loads at point A. At some time instant, due to shock, acoustic loads, machinery noise, or unsteady aerodynamic loading effects, etc., there will be an increase in vibratory motion beyond a preset metric, which may be time domain, frequency domain, or both. At point B, the system is excited beyond a desired condition. The internal digital controlled circuit will then turn ON the synthetic active control circuit by drawing on an external energy source and implementing the PWM control in the preferred implementation to enable the creation of the desired generalized impedance as seen by the load. The system remains externally active until an acceptable quiescent state is reached. At this juncture D1, the digital control circuit can either idle, shown in FIG. 11 as time interval D1-D2 until vibratory loads reach a level sufficient for the controller to activate the preferred four quadrant switching circuit at point E1, or it can run in the internally active externally passive mode, shown in FIG. 11 as the time interval after point F1. Since the internally active—externally passive mode introduces more damping into the system than simple idle mode, under most circumstances, it will take longer before the "trigger point" for the externally synthetic active mode of operation mode of control exerts itself via the internal supervisory control circuit. The longer internally active—externally passive period is illustrated in FIG. 11; i.e., the time interval after F1 is longer than the time interval between D1 and D2.

Method for Selecting Parameters for an Optimal Controller

A further aspect of the present invention provides a method for determining an optimal state space controller in its admittance form together with its embodiment as a lossless, energy efficient apparatus. The design method and the embodiment completely follow from, and are part of the current invention. The steps that formulate this method of designing an optimal admittance controller are as follows:

Step 1: In accordance with the method of admittance control design the generalized admittance network consists of three subcircuits, all three of which, in practice, are simultaneously realized by high frequency switching electronics. However, for purposes of describing the method we will keep the three subcircuits separate.

Step 2: The first circuit corresponds to a set of negative impedances and/or inductances that correspond to the actual reactive values of any bi-coupled capacitive or inductive actuation mechanisms and is herein referred to as the negative reactance subcircuit. The second subcircuit consists of non-dissipative passive components, e.g., capacitors, as defined by the admittance method for controller design. The third subcircuit consists of dissipative passive components, e.g., resistors, as defined by the admittance method for controller design. These second and third subcircuits are direct consequences of the admittance control method along with any external constraints, for example, a desire that the control structure be totally decoupled, and are normally combined and form the control subcircuit. The control subcircuit as defined by the admittance control method cannot vary, and is functionally dependent upon the given transductive structure, the desired performance metric and any constraint upon the structure of the controller and its order corresponds to the number of capacitive or inductive/active elements present. The component values that the admittance method allows to be varied are herein referred to as the free admittance design components.

Step 3: The range that the free admittance design component parameters can vary are concatenated to form a closed and bounded search space $\Omega$ within $R_+^n$, where n is the number free admittance design components, and $R_+$ is the non-negative real line.

Step 4: Conventional numerical algorithms are employed to converge to the optimal value in the search space $\Omega$. Such well established numerical procedures include steepest descent-based algorithms, Newton-based algorithms, genetic algorithms or random search algorithms. These are all commercially available. The choice of numerical algorithm method and convergence rate is not germane to the present invention, other than acknowledgment that such exist and can be used in this step.

Step 5: The optimal value in $\Omega$ corresponds to a specific choice of component values forming a specific control subcircuit. This circuit is now "minimized" electrically by deleting zero value components and combining resistor values where possible.

Step 6: The optimized subcircuit is combined with the negative reactance circuit to form a new circuit that constitutes the optimally designed admittance controller.

The optimal control method for designing a state space controller for a bicoupled transductive system may use a result discovered by the present inventors. This result states that a fixed state space controller, optimal or non-optimal, for a fixed transductive system that does not lessen the damping factor at any frequency can be embodied in the form of a concatenated negative reactance subcircuit and the control subcircuit as described above.

It is a direct consequence of this result that the admittance method actually "sweeps" through all state space controllers for such systems that do not lessen the damping factor at any frequency. Theretofore, it "sweeps" through all closed-loop state space controllers that improve damping performance through the closed-loop design. Theretofore, the optimal admittance controller is, in fact, a method for designing an embodiment of the optimal state space controller as a single unified generalized admittance circuit.

The invention describes how an admittance controller may be embodied as a lossless, energy efficient, high speed switching network that simultaneously implements both the negative reactance subcircuit and the passive control subcircuit. The optimal choice of component values in the control circuit, that is availed by searching through the closed and bounded search space $\Omega$, corresponding to the free admittance design component parameters in the admittance control method is now selected within the current mode or voltage mode embodiments as lossless, energy efficient and compact generalized synthetic networks. This embodiment is necessarily now the embodiment of both the optimal quasi-active controller and optimal state space controller for the given fixed transductive system subject to any performance objectives, constraints or control structure requirements as provided.

While the invention has been described in some detail by way of illustration and example, it should be understood that the invention is susceptible to various modifications and alternative forms, and is not restricted to the specific embodiments set forth. It should be understood that these specific embodiments are not intended to limit the invention but, on the contrary, the intention is to cover all modifications, equivalents, and alternatives falling within the spirit and scope of the invention.

What is claimed is:

1. A method for synthesizing a generalized admittance comprising:

sensing a current flowing through a load;

calculating a voltage value corresponding to the sensed current to simulate a negative reactance when measured from the load; and controlling a switching circuit to produce an average voltage over a switching cycle across the load, the average voltage value being equal to the calculated voltage value.

2. The method of claim 1 wherein controlling the switching circuit to produce an average voltage value comprises:

producing a first voltage pulse across the load for a first phase of the switching cycle and a second voltage pulse across the load for a second phase of the switching cycle, the first pulse and the second pulse having an average value over the switching cycle, the average value being equal to the calculated voltage value; and filtering the first pulse and the second pulse to present the average voltage value to the load.

3. The method of claim 1 further comprising storing a load current produced during the first phase in an inductor and returning the load current from the inductor to a power supply during the second phase; and storing a load current produced during the second phase in the inductor and returning the current to the power supply after the second phase.

4. A quasi active controller comprising:

a bicoupled device having a predetermined reactance;

a first current sensor coupled to the bicoupled device, the current sensor sensing a current flowing through the bicoupled device;

a first signal processing device coupled to the current sensor, the signal processing device calculating a voltage value using a first predetermined transfer function;

a control circuit coupled to the first signal processing device, the control circuit producing a control signal in response to the voltage value; and a switching circuit coupled to the control circuit and to the bicoupled device, the switching circuit receiving the control signal and producing a voltage responsive to the control signal to simulate a generalized admittance to the bicoupled device.

5. The quasi active controller of claim 4 further comprising:

a capacitor coupled in parallel with the bicoupled device;

a current sensor coupled to the capacitor to measure a capacitor current; and a second signal processing device coupled to the current sensor, the second signal processing device producing a signal in response to the capacitor current and feeding the signal back to the switching circuit to enable the switching circuit to drive a reactive load.

6. The quasi active controller of claim 4 wherein the bicoupled device comprises a piezoelectric device.

7. The quasi active controller of claim 4 wherein the switching circuit comprises an H bridge.

8. The quasi active controller of claim 4 wherein the switching circuit comprises a half bridge.

9. A quasi active controller comprising:

a bicoupled device having a predetermined reactance;

a voltage sensor coupled to the bicoupled device, the voltage sensor sensing a voltage across the bicoupled device;

a first signal processing device coupled to the voltage sensor, the first signal processing device computing a current value using a predetermined transfer function;

a control circuit coupled to the signal processing device, the control circuit producing a control signal in response to the current value; and a switching circuit coupled to the control circuit and to the bicoupled device, the switching circuit receiving the control signal and producing a voltage responsive to the control signal to simulate a generalized admittance to the device.

10. The quasi active controller of claim 9 further comprising:

a capacitor coupled in parallel with the bicoupled device;

a current sensor coupled to the capacitor to sense a capacitor current; and a second signal processing device coupled to the current sensor, the second signal processing device producing a signal in response to the capacitor current and feeding the signal to the switching circuit to enable the switching circuit to drive a reactive load.

11. The quasi active controller of claim 9 wherein the bicoupled device comprises a piezoelectric device.

12. The quasi-active controller of claim 9 wherein the switching circuit comprises an H bridge.

13. The quasi-active controller of claim 9 wherein the switching circuit comprises a half bridge.

14. A method for selecting optimal parameters for a synthetic active controller comprising:

dividing a generalized admittance circuit into a first subcircuit, a second subcircuit, and a third subcircuit, the first subcircuit including a negative reactance element, the second subcircuit including a passive non-dissipative element, and the third subcircuit including a passive dissipative element;

selecting a reactance value for the negative reactance element in the first subcircuit by determining and negating the reactance value for the bicoupled device;

determining a range of values for the elements in the second and third subcircuits based on a predetermined performance objective;

selecting an optimal value for the elements in the second and third subcircuits using conventional algorithms; and combining the optimized second and third subcircuits with the first subcircuit to form an optimal admittance controller.

15. The method of claim 14 further comprising building a controller that implements the first and third subcircuits losslessly.

16. The method of claim 14 further comprising building a controller that implements the first, second, and third subcircuits losslessly.

* * * * *